(12) United States Patent
Chuang et al.

(10) Patent No.: US 12,591,015 B2
(45) Date of Patent: Mar. 31, 2026

(54) BATTERY RESISTANCE MEASURING METHOD, BATTERY POWER MANAGING METHOD AND ELECTRONIC DEVICE USING THE METHOD

(71) Applicant: MEDIATEK INC., Hsin-Chu (TW)

(72) Inventors: Jia-You Chuang, Hsinchu City (TW); Jui-Chi Wu, Hsinchu City (TW); Kuan-Yu Chen, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 75 days.

(21) Appl. No.: 18/504,120

(22) Filed: Nov. 7, 2023

(65) Prior Publication Data

US 2025/0147108 A1     May 8, 2025

(51) Int. Cl.
*G01R 31/3842*     (2019.01)
*G01R 31/367*     (2019.01)
*G01R 31/388*     (2019.01)
*G01R 31/396*     (2019.01)

(52) U.S. Cl.
CPC ....... *G01R 31/3842* (2019.01); *G01R 31/367* (2019.01); *G01R 31/388* (2019.01); *G01R 31/396* (2019.01)

(58) Field of Classification Search
None
See application file for complete search history.

(56) References Cited

U.S. PATENT DOCUMENTS

| | | | |
|---|---|---|---|
| 2002/0000790 A1* | 1/2002 | Sano | G01R 31/3647 320/162 |
| 2009/0058423 A1* | 3/2009 | Abe | G01R 31/3648 324/426 |
| 2009/0224771 A1* | 9/2009 | Deveau | G01R 31/386 324/600 |
| 2010/0001693 A1* | 1/2010 | Iida | H01M 10/4285 324/427 |
| 2012/0004875 A1* | 1/2012 | Maeda | H01M 10/48 702/63 |
| 2017/0370995 A1 | 12/2017 | Huaug | |
| 2021/0123980 A1 | 4/2021 | Kataoka | |
| 2023/0138447 A1 | 5/2023 | Ko | |

* cited by examiner

*Primary Examiner* — Jas A Sanghera
(74) *Attorney, Agent, or Firm* — Winston Hsu

(57)     ABSTRACT

A battery resistance measuring method, applied to a battery with a battery resistance, comprising: (a) acquiring charge variation of the battery for a measuring time interval; (b) acquiring a voltage difference between a first battery voltage and a second battery voltage for the measuring time interval, wherein the first battery voltage is a battery voltage with loading and the second battery voltage is a battery voltage without loading; and (c) computing a battery resistance according to the charge variation and the voltage difference, and updating the battery resistance to a battery resistance table of the battery. The above-mentioned steps (a), (b) and (c) may be performed by the electronic device, which can be a mobile electronic device such as a mobile phone or a plate computer.

19 Claims, 7 Drawing Sheets

100

105     103

Storage device     Processing circuit

101

Battery

Electronic device

| Measure Current | Vbat_1 | Vbat_2 | Discharged charge amount | R | Percentage |
|---|---|---|---|---|---|
| C_M | Vbat_11 | Vbat_21 | 0 | X | 100 |
| C_M | Vbat_12 | Vbat_22 | 30 | R_1 | 99 |
| C_M | Vbat_13 | Vbat_23 | 60 | R_2 | 98 |
| C_M | Vbat_14 | Vbat_24 | 90 | R_3 | 97 |
| C_M | Vbat_15 | Vbat_25 | 120 | R_5 | 96 |
| C_M | Vbat_16 | Vbat_26 | 150 | R_6 | 95 |
| C_M | Vbat_17 | Vbat_27 | 180 | R_7 | 94 |
| C_M | Vbat_18 | Vbat_28 | 210 | R_8 | 93 |
| C_M | Vbat_19 | Vbat_29 | 240 | R_9 | 92 |
| C_M | Vbat_20 | Vbat_30 | 270 | R_10 | 91 |
| C_M | Vbat_21 | Vbat_31 | 300 | R_11 | 90 |

FIG. 3

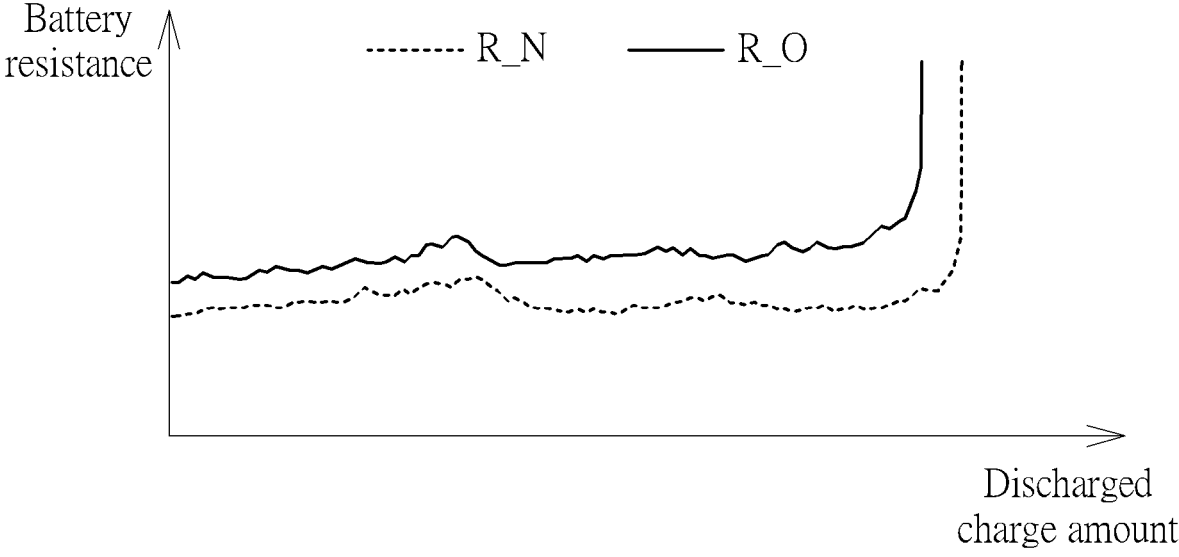
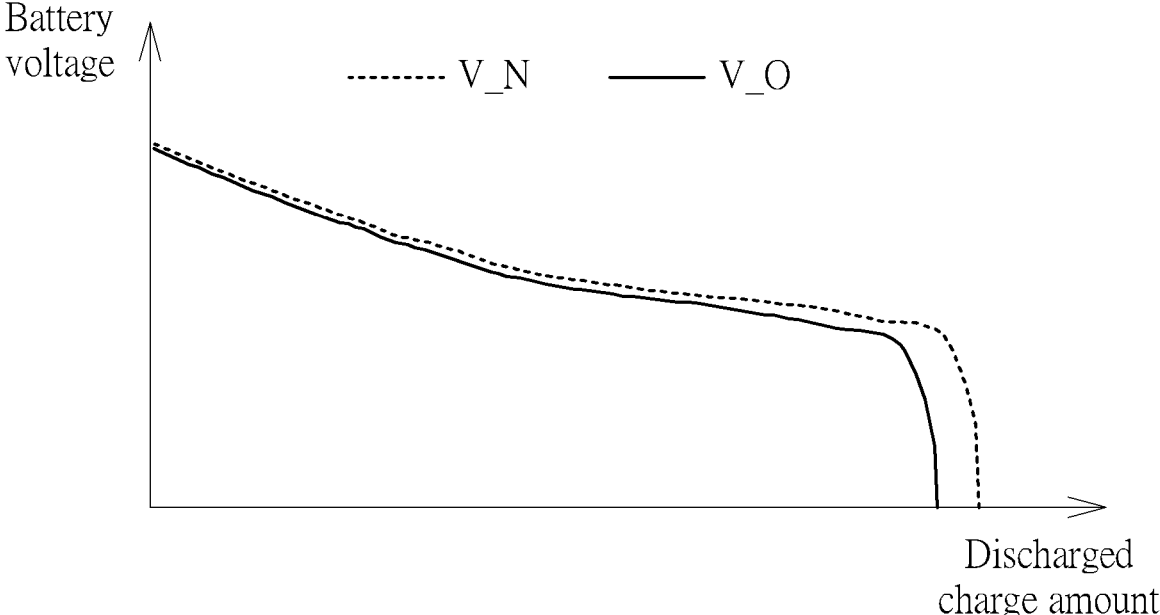
FIG. 5

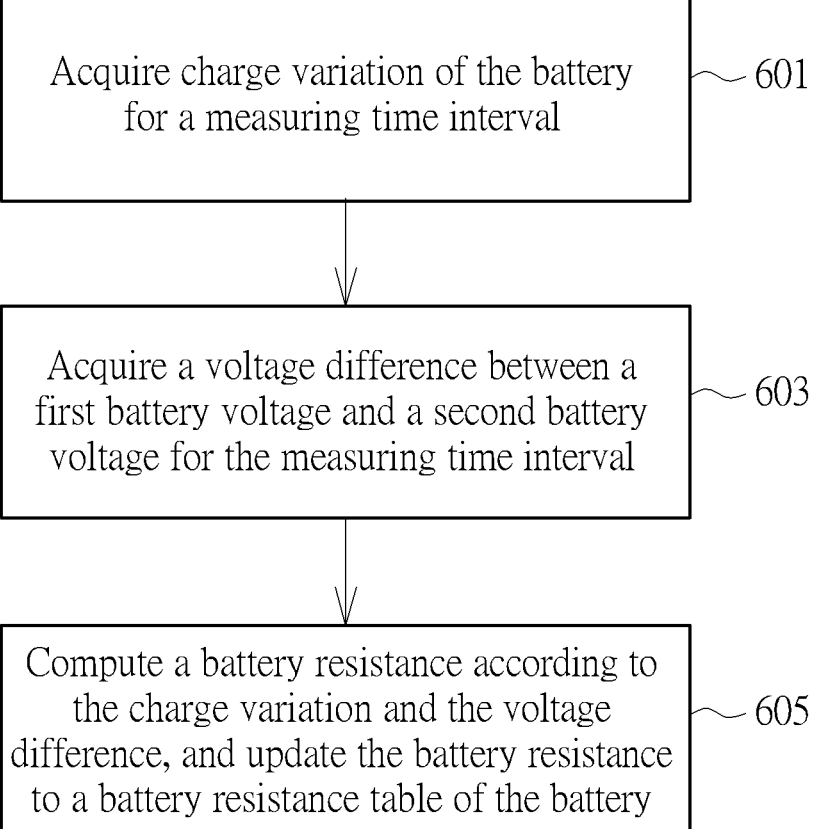

Acquire charge variation of the battery for a measuring time interval ~ 601

Acquire a voltage difference between a first battery voltage and a second battery voltage for the measuring time interval ~ 603

Compute a battery resistance according to the charge variation and the voltage difference, and update the battery resistance to a battery resistance table of the battery ~ 605

FIG. 6

BATTERY RESISTANCE MEASURING METHOD, BATTERY POWER MANAGING METHOD AND ELECTRONIC DEVICE USING THE METHOD

BACKGROUND

As the usage time increases, the battery gradually degrades. However, the degradation of the battery may cause the battery to have a larger battery resistance. If the battery resistance is larger, the maximum battery usage time is correspondingly reduced. However, in related technique field, no simple battery resistance measuring method is provided.

SUMMARY

One objective of the present application is to provide a battery resistance measuring method which can measure a battery resistance by a simple electronic device.

Another objective of the present application is to provide a battery power managing method using a battery resistance measuring method which can measure a battery resistance by a simple electronic device.

Another objective of the present application is to provide an electronic device using a battery resistance measuring method which can measure a battery resistance by the electronic device.

One embodiment of the present application provides a battery resistance measuring method, applied to a battery with a battery resistance, comprising: (a) acquiring charge variation of the battery for a measuring time interval; (b) acquiring a voltage difference between a first battery voltage and a second battery voltage for the measuring time interval, wherein the first battery voltage is a battery voltage with loading and the second battery voltage is a battery voltage without loading; and (c) computing a battery resistance according to the charge variation and the voltage difference, and updating the battery resistance to a battery resistance table of the battery.

Another embodiment of the present application provides a battery power managing method, applied to a battery with a battery resistance, comprising: (a) acquiring charge variation of the battery for a measuring time interval; (b) acquiring a voltage difference between a first battery voltage and a second battery voltage for the measuring time interval, wherein the first battery voltage is a battery voltage with loading and the second battery voltage is a battery voltage without loading; (c) computing a battery resistance according to the charge variation and the voltage difference, and updating the battery resistance to a battery resistance table of the battery; and (d) managing the battery power according to the battery resistance table.

Still another embodiment of the present application provides an electronic device, comprising: a battery; and a processing circuit, configured to perform following steps: (a) acquiring charge variation of the battery for a measuring time interval; (b) acquiring a voltage difference between a first battery voltage and a second battery voltage for the measuring time interval, wherein the first battery voltage is a battery voltage with loading and the second battery voltage is a battery voltage without loading; and (c) computing a battery resistance according to the charge variation and the voltage difference, and updating the battery resistance to a battery resistance table of the battery.

The above-mentioned steps (a), (b) and (c) may be performed by the electronic device, which can be a mobile electronic device such as a mobile phone or a plate computer.

In view of above-mentioned embodiments, the battery resistance may be measured by a simple electronic device, and no extra measuring equipment is needed. Also, the battery resistance table is not fixed and can be updated at any required time.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 and FIG. 3 are schematic diagrams illustrating a battery resistance measuring method according to one embodiment of the present application.

FIG. 5 is a curve diagram illustrating relations of the discharged charge amount and the battery resistance, and relations of the discharged charge amount and the battery voltage.

FIG. 6 is a flow chart illustrating a battery resistance measuring method according to one embodiment of the present application.

DETAILED DESCRIPTION

In the following descriptions, several embodiments are provided to explain the concept of the present application. It will be appreciated that the system, the device, the apparatus or the module depicted in following embodiments can be implemented by hardware (ex. circuit) or the combination of hardware and software (ex. a processing unit executing at least one program). The term "first", "second", "third" in following descriptions are only for the purpose of distinguishing different one elements, and do not mean the sequence of the elements. For example, a first device and a second device only mean these devices can have the same structure but are different devices.

Figure 1:
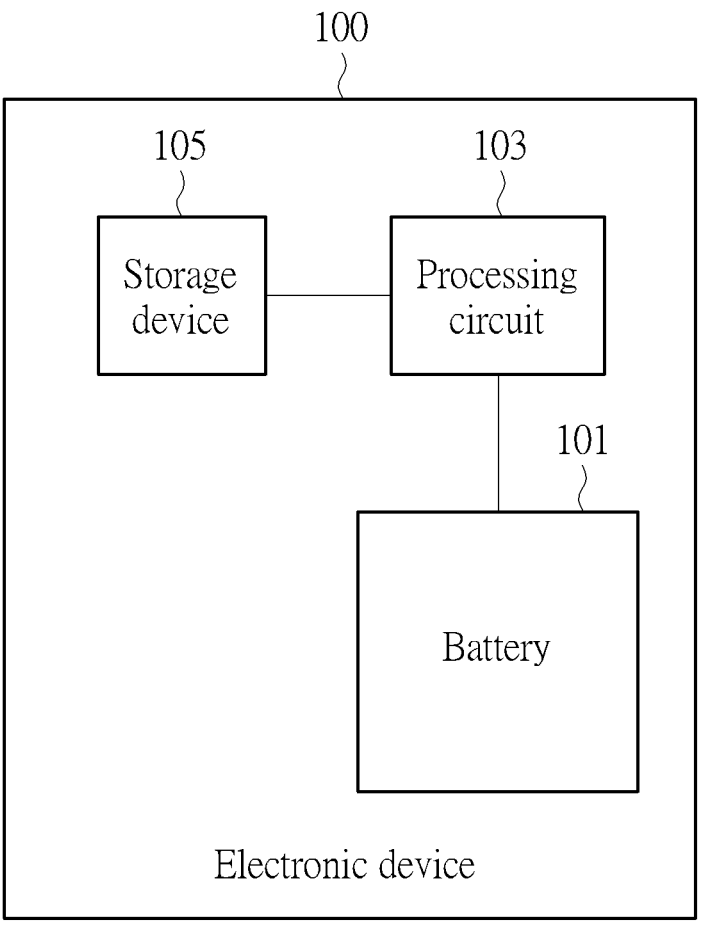
FIG. 1 is a block diagram illustrating an electronic device according to one embodiment of the present application.

FIG. 1 is a block diagram illustrating an electronic device 100 according to one embodiment of the present application. The electronic device 100 can be, for example, a mobile electronic device or a desktop computer. The mobile electronic device can be, for example, a mobile phone, a plate computer or a smart watch. As shown in FIG. 1, the electronic device 100 comprises a battery 101, a processing circuit 103 and a storage device 105. The processing circuit 103 acquires a charge variation of the battery 101 for a measuring time interval (for the convenience of explaining, such step is named step S102 in the following). Also, the processing circuit 103 acquires a voltage difference between a first battery voltage and a second battery voltage for the measuring time interval, wherein the first battery voltage is a battery voltage with loading and the second battery voltage is a battery voltage without loading (for the convenience of explaining, such step is named step S104 in the following). Besides, the processing circuit 103 computes a battery resistance according to the charge variation and the voltage difference, and updates the battery resistance to a battery resistance table of the battery 101 (for the convenience of explaining, such step is named step S106 in the following). Details of the steps S102, S104 and S106 will be described in following descriptions.

Figure 2:
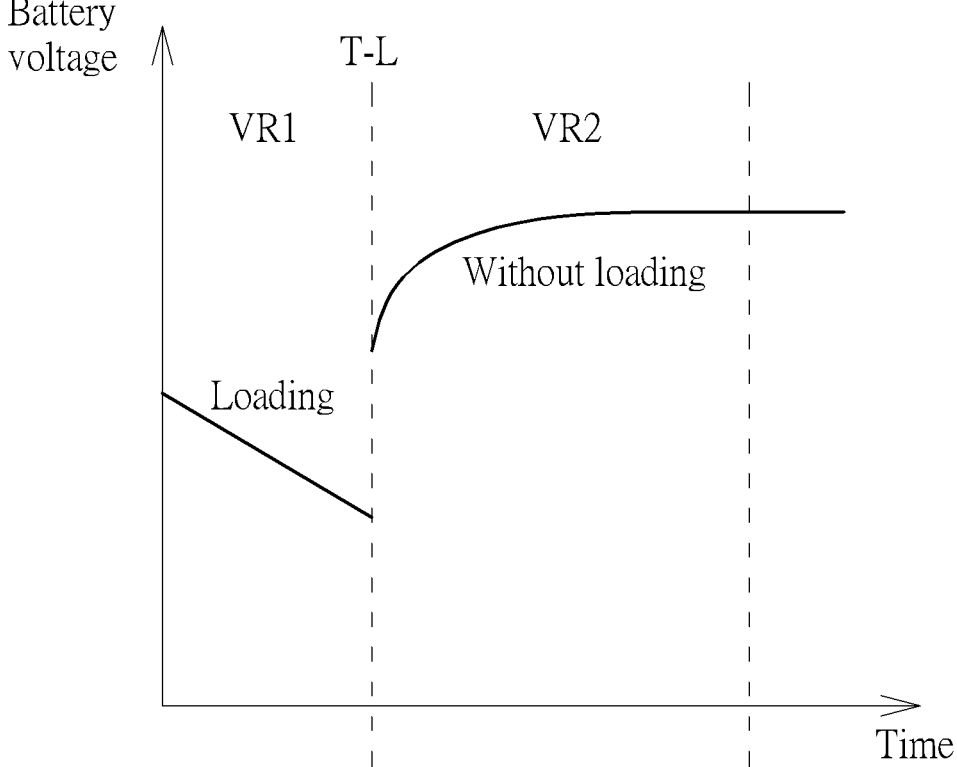
Figure 4:
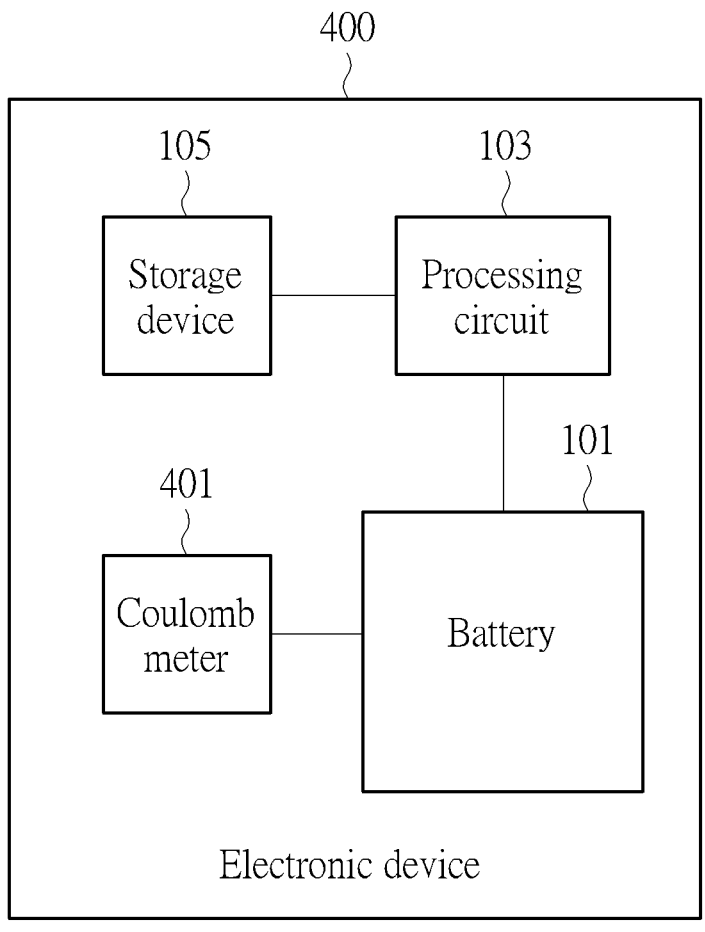
FIG. 4 is a block diagram illustrating an electronic device according to another embodiment of the present application.

FIG. 2, FIG. 3 and FIG. 4 are schematic diagrams illustrating a battery resistance measuring method according to one embodiment of the present application. Specifically, FIG. 2 is a schematic diagram illustrating the battery voltage with loading and the battery voltage without loading illustrated in the step S104. In the region VR1 of FIG. 2, the battery voltage is a battery voltage with loading. In one embodiment, the battery voltage with loading means the battery voltage when the electronic device with the battery is active or is using some applications. For example, the battery voltage with loading means the battery voltage when a mobile phone with the battery is active, or is making a phone call, or is playing a game. In such state, the battery voltage gradually goes down since the electronic device continuously consuming the power provided by the battery.

On the contrary, in the region VR2, the battery voltage without loading means the battery voltage when the electronic device with the battery is in a non-active state or in a sleep state. As shown in FIG. 2, after the loading is released at the time T_L, the battery recovers to a stable value. For more detail, in one embodiment, after the loading is released at the time T_L, the battery voltage raises up quickly and then slowly increases, and keeps at a stable value finally. In following embodiments, the second voltage means a battery voltage without loading in a stable state.

FIG. 3 is a schematic diagram illustrating a battery resistance table. In FIG. 3, the measure current C M means the current which is drained from the battery for each battery resistance measurement. In one embodiment, a current value of the measure current C_M is 400 mA, but not limited. Also, the first battery voltage Vbat_1 is the above-mentioned first battery voltage, which is the battery voltage with loading. Further, the second battery voltage Vbat_2 is the above-mentioned second battery voltage, which is the battery voltage without loading. The discharged charge amount means the total charge which the battery has provided. In the embodiment of FIG. 3, the measurement unit of the discharged charge amount is mAh (mA per hour), and each time of battery resistance measurement causes 30 mAh of the discharged charge amount, but not limited. The parameter R means the battery resistance. Moreover, the percentage means how much power of the battery remains.

In the first time of battery resistance measurement, the battery does not provide any power yet, thus the battery has 100% of power, and the first battery voltage Vbat_11, second battery voltage Vbat_21 are identical. In such case, the battery resistance is ignored since it may be infinite since the first battery voltage Vbat_11, second battery voltage Vbat_21 are identical. In the second time of battery resistance measurement, the battery has provided 30 mAh of discharged charge, thus the battery power decreases to 99%. In such case, the battery resistance R_1 can be acquired by $$\frac{(Vbat_{12} - Vbat_{22})}{C\_M}.$$

Following the same rule, in the third time of battery resistance measurement, the battery has provided 60 mAh of discharged charge, thus the battery power decreases to 98%. In such case, the battery resistance R_2 can be acquired by $$\frac{(Vbat_{13} - Vbat_{23})}{C\_M}.$$

Such steps can be repeated, until a required battery resistance table is built.

The steps S102, S104, S106 of FIG. 1 may correspond to the steps illustrated in FIG. 3. For example, the step S102 acquires charge variation of the battery for a measuring time interval. The measuring time interval means a time interval for one time of battery resistance measurement. The charge variation may mean the discharged charge amount for each time of the battery resistance measurement, for example, the 30 mAh for each time of the battery resistance measurement in FIG. 1. Also, the step S104 acquires a voltage difference between a first battery voltage and a second battery voltage for the measuring time interval, and the step S106 computes a battery resistance according to the charge variation and the voltage difference, and updates the battery resistance to a battery resistance table of the battery. For example, in the second time of battery resistance measurement of FIG. 3, the battery has provided 30 mAh of discharged charge, and the battery resistance R_1 can be acquired by $$\frac{(Vbat_{12} - Vbat_{22})}{C\_M}.$$

In view of above-mentioned descriptions, the following Equation (1) can be acquired:

$$T \times \frac{Va}{R} = Car \qquad \text{Equation (1)}$$

T means the measuring time interval in the step S102, which can be a fixed value. Car means the charge variation in the step S102, Va means the voltage difference in the step S104, and R means the batter resistance.

Based on the Equation (1), the Equation (2) for measuring a battery resistance can be acquired:

$$T \times \frac{Va}{Car} = R \qquad \text{Equation (2)}$$

As above-mentioned, the steps of measuring the battery resistance may be repeated for a plurality of times to accomplish the battery resistance table. Therefore, the equation of the battery resistance in the battery resistance table can be represented as:

$$R\_i = T \times \frac{Va\_i}{Car\_i} \qquad \text{Equation (3)}$$

i means the battery is measured for the i-th time. For example, in the embodiment of FIG. 3, if i=1, the battery resistance is ignored since the battery resistance is infinite. If i=2, the measured battery resistance is the battery resistance R_1. If i=3, the measured battery resistance is the battery resistance R_2.

Please refer to FIG. 1 again, in the embodiment of FIG. 1, the charge variation Car is acquired by a coulomb counting method. Specifically, the processing circuit 103 executes at least one program in the storage device 105 to perform the coulomb counting method. However, the charge variation Car can be measured by a hardware.

FIG. 4 is a block diagram illustrating an electronic device 400 according to one embodiment of the present application. The electronic device 400 can be, for example, a mobile electronic device or a desktop computer. As shown in FIG. 4, the electronic device 400 comprises a battery 101, a processing circuit 103, a storage device 105 and a coulomb meter 401. The coulomb meter 401 is a hardware and can provide a more accurate charge variation. The processing circuit 103 acquires a charge variation of the battery 101 for a measuring time interval (step S102) via the coulomb meter 401. Also, the processing circuit 103 acquires a voltage difference between a first battery voltage and a second battery voltage for the measuring time interval, wherein the first battery voltage is a battery voltage with loading and the second battery voltage is a battery voltage without loading (step S104). Besides, the processing circuit 103 computes a battery resistance according to the charge variation and the voltage difference, and updates the battery resistance to a battery resistance table of the battery 101 (step S106).

In related art, the battery resistance table is built by a specific measurement equipment before selling the battery to the user. Such battery resistance table is fixed since the user does not have the specific measurement equipment for measuring the battery resistance. However, based on the embodiments of FIG. 1 and FIG. 4, the user can measure the battery resistance by the electronic device and no specific measurement equipment is needed. Accordingly, the battery resistance table can be updated in real time to meet a real condition of the battery.

FIG. 5 is a curve diagram illustrating relations of the discharged charge amount and the battery resistance, and relations of the discharged charge amount and the battery voltage. In the upper diagram, the curve R_N means the battery resistance of a relative new battery (e.g., a battery which is not used yet). Also, in the upper diagram, the curve R_O means the battery resistance of a relative old battery (e.g., a battery which already degrades). As shown in the upper diagram of FIG. 5, the battery resistance greatly increases after the battery has provided a large amount of discharged charge. Also, the battery resistance of the relative old battery is always larger than the battery resistance of the relative new battery.

In the lower diagram, the curve V_N means the battery voltage of the relative new battery. Also, in the lower diagram, the curve V_O means the battery voltage of the relative old battery. As shown in the lower diagram of FIG. 5, the battery voltage greatly decreases after the battery has provided a large amount of discharged charge, since the battery resistance greatly increases. Also, the battery voltage of the relative old battery is always lower than the battery voltage of the relative new battery.

Almost all electronic devices have a minimum operation voltage. If the battery voltage is smaller than such minimum operation voltage, the electronic device may turn off. For example, if the battery is provided in a mobile phone but the battery voltage is smaller than the minimum operation voltage, the mobile phone turns off. As shown in the lower diagram of FIG. 5, the battery voltage of the old battery drops quickly due to the large battery resistance. Accordingly, the electronic device with an old battery always turns off unexpectedly.

In view of the descriptions of FIG. 5, if the battery resistance is not frequently measured and the battery power is not properly managed according to the battery resistance, the maximum usage of the battery may decrease significantly. Accordingly, in one embodiment, the steps of measuring the battery resistance and updating the battery resistance table are periodically performed by the electronic device 100, in which the battery 101 is provided. As above-mentioned, the electronic device 100 may be a mobile electronic device such as a mobile phone or a plate computer. The period for measuring the battery resistance and updating the battery resistance table may be set for different requirements. By this way, the battery power may be managed according to the battery resistance table, to extend the battery usage time. However, the measurement of the battery resistance may be triggered by the user at any required time, rather than limited to be periodically performed.

In related art, more than one fixed battery resistance tables is provided to an electronic device, and different battery resistance tables are used for the batteries with different degrading time. However, such mechanism may still non-ideal since all the battery resistance tables may be non-accurate. For the present invention, in one embodiment, the battery has only one battery resistance table which is periodically, to make sure the battery resistance table meets the real condition of the battery.

In view of above-mentioned descriptions, a battery resistance measuring method can be acquired. FIG. 6 is a flow chart illustrating a battery resistance measuring method according to one embodiment of the present application.

FIG. 6 comprises following steps:

Step 601

Acquire charge variation of the battery for a measuring time interval. For example, as illustrated in FIG. 3, the battery provided 30 mAh of discharged charge amount for one time of battery resistance measurement.

Step 603

Acquire a voltage difference between a first battery voltage and a second battery voltage for the measuring time interval. The first battery voltage is a battery voltage with loading (e.g., the first voltage Vbat_12 in FIG. 3) and the second battery voltage (e.g., the second voltage Vbat_22 in FIG. 3) is a battery voltage without loading.

Step 605

Compute a battery resistance according to the charge variation and the voltage difference, and update the battery resistance to a battery resistance table of the battery. For example, computing the battery resistance R_1 by $$\frac{(Vbat_{12} - Vbat_{22})}{C\_M}.$$

As above-mentioned, the steps 601, 603, and 605 can be periodically performed by the electronic device 100 in FIG. 1 or the electronic device 400 in FIG. 4. The electronic devices 100, 400 may be mobile electronic devices such as a mobile phone or a plate computer.

Figure 7:
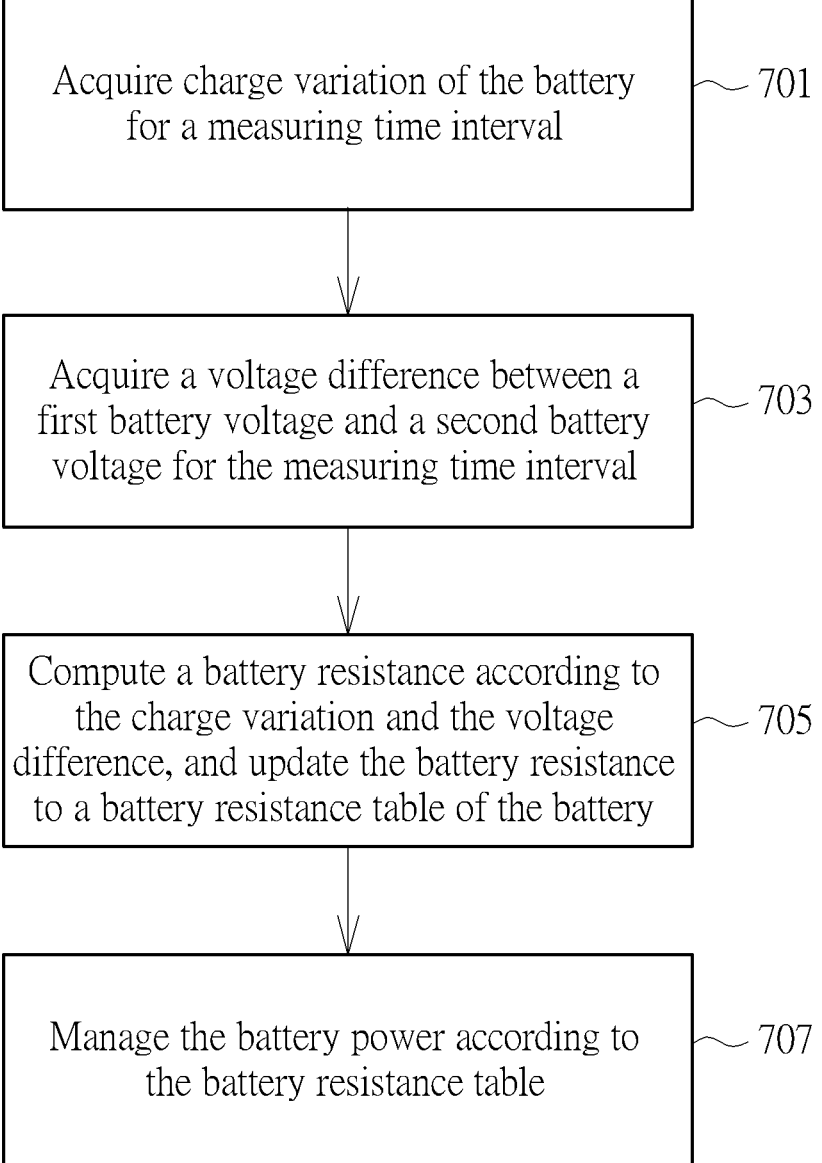
FIG. 7 is a flow chart illustrating a battery power managing method according to one embodiment of the present application.

As above-mentioned, the battery power may be managed according to the battery resistance table. FIG. 7 is a flow chart illustrating a battery power managing method according to one embodiment of the present application.

FIG. 7 comprises following steps:

Step 701

Acquire charge variation of the battery for a measuring time interval. For example, as illustrated in FIG. 3, the battery provided 30 mAh of discharged charge amount for one time of battery resistance measurement.

Step 703

Acquire a voltage difference between a first battery voltage and a second battery voltage for the measuring time interval. The first battery voltage is a battery voltage with loading (e.g., the first voltage Vbat_12 in FIG. 3) and the second battery voltage (e.g., the second voltage Vbat_22 in FIG. 3) is a battery voltage without loading.

Step 705

Compute a battery resistance according to the charge variation and the voltage difference, and update the battery resistance to a battery resistance table of the battery. For example, computing the battery resistance R_1 by $$\frac{(Vbat_{12} - Vbat_{22})}{C\_M}.$$

Step 707

Manage the battery power according to the battery resistance table. For example, if the new battery resistance indicates that a degrading level of the battery is larger than a threshold level, some functions of the electronic device is limited. For example, if the electronic device has a display, brightness of the display is limited. For another example, if the electronic device has a flash light, the brightness or the usage frequency of the flash light may be limited.

As above-mentioned, the steps 601, 603, and 605 can be periodically performed by the electronic device 100 in FIG. 1 or the electronic device 400 in FIG. 4. The electronic devices 100, 400 may be mobile electronic devices such as a mobile phone or a plate computer.

In view of above-mentioned embodiments, the battery resistance may be measured by a simple electronic device, and no extra measuring equipment is needed. Also, the battery resistance table is not fixed and can be updated at any required time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A battery resistance measuring method, applied to a battery with a battery resistance, comprising:
   (a) acquiring charge variation of the battery for a measuring time interval;
   (b) acquiring a voltage difference between a first battery voltage and a second battery voltage for the measuring time interval, wherein the first battery voltage is a battery voltage with loading and the second battery voltage is a battery voltage without loading; and
   (c) computing a battery resistance according to the charge variation and the voltage difference, and updating the battery resistance to a battery resistance table of the battery;
   wherein the battery voltage with loading means a battery voltage when an electronic device with the battery is active or is using at least one application;
   wherein the battery voltage without loading means a battery voltage when the electronic device is in a non-active state or in a sleep state.

2. The battery resistance measuring method of claim 1, wherein the steps (a) (b) and (c) are periodically performed by the electronic device.

3. The battery resistance measuring method of claim 1, wherein the electronic device is a mobile electronic device, and the steps (a) (b) and (c) are performed by the mobile electronic device.

4. The battery resistance measuring method of claim 1, wherein the step (a) is performed by a coulomb meter which is hardware.

5. The battery resistance measuring method of claim 1, wherein the step (a) is performed by a coulomb counting method.

6. The battery resistance measuring method of claim 1, wherein the battery has only one battery resistance table.

7. A battery power managing method, applied to a battery with a battery resistance, comprising:
   (a) acquiring charge variation of the battery for a measuring time interval;
   (b) acquiring a voltage difference between a first battery voltage and a second battery voltage for the measuring time interval, wherein the first battery voltage is a battery voltage with loading and the second battery voltage is a battery voltage without loading;
   (c) computing a battery resistance according to the charge variation and the voltage difference, and updating the battery resistance to a battery resistance table of the battery; and
   (d) managing the battery power according to the battery resistance table;
   wherein the battery voltage with loading means a battery voltage when the electronic device with the battery is active or is using at least one application;
   wherein the battery voltage without loading means a battery voltage when the electronic device with the battery is in a non-active state or in a sleep state.

8. The battery power managing method of claim 7, wherein the steps (a) (b) and (c) are periodically performed by the electronic device.

9. The battery power managing method of claim 7, wherein the electronic device is a mobile electronic device, and the steps (a) (b) and (c) are performed by the mobile electronic device.

10. The battery power managing method of claim 7, wherein the step (a) is performed by a coulomb meter which is a hardware.

11. The battery power managing method of claim 7, wherein the step (a) is performed by a coulomb counting method.

12. The battery power managing method of claim 7, wherein the battery has only one battery resistance table.

13. An electronic device, comprising:
   a battery; and
   a processing circuit, configured to perform following steps:
      (a) acquiring charge variation of the battery for a measuring time interval;
      (b) acquiring a voltage difference between a first battery voltage and a second battery voltage for the measuring time interval, wherein the first battery voltage is a battery voltage with loading and the second battery voltage is a battery voltage without loading; and
      (c) computing a battery resistance according to the charge variation and the voltage difference, and updating the battery resistance to a battery resistance table of the battery;

wherein the battery voltage with loading means a battery voltage when an electronic device with the battery is active or is using at least one application;

wherein the battery voltage without loading means a battery voltage when the electronic device is in a non-active state or in a sleep state.

14. The electronic device of claim 13, wherein the steps (a) (b) and (c) are periodically performed by the electronic device.

15. The electronic device of claim 13, wherein the electronic device is a mobile electronic device, and the steps (a) (b) and (c) are performed by the mobile electronic device.

16. The electronic device of claim 13, further comprising a coulomb meter which is a hardware, wherein the step (a) is performed by the coulomb meter.

17. The electronic device of claim 13, wherein the step (a) is performed by a coulomb counting method.

18. The electronic device of claim 13, wherein the battery has only one battery resistance table.

19. The electronic device of claim 13, wherein the processing circuit further manages a battery power of the battery according to the battery resistance table.

\* \* \* \* \*